United States Patent
Philip et al.

(10) Patent No.: US 12,408,571 B2
(45) Date of Patent: Sep. 2, 2025

(54) PHASE CHANGE MEMORY WITH GRADED HEATER

(71) Applicant: International Business Machines Corporation, Armonk, NY (US)

(72) Inventors: Timothy Mathew Philip, Albany, NY (US); Kevin W. Brew, Niskayuna, NY (US); Jin Ping Han, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 511 days.

(21) Appl. No.: 17/358,293

(22) Filed: Jun. 25, 2021

(65) Prior Publication Data

US 2022/0416162 A1    Dec. 29, 2022

(51) Int. Cl.
   *H10N 70/00*    (2023.01)
(52) U.S. Cl.
   CPC ....... *H10N 70/8613* (2023.02); *H10N 70/021* (2023.02); *H10N 70/841* (2023.02)
(58) Field of Classification Search
   CPC .................................................... H10N 70/00
   See application file for complete search history.

(56) References Cited

U.S. PATENT DOCUMENTS

| | | | |
|---|---|---|---|
| 6,894,305 B2 | 5/2005 | Yi et al. | |
| 6,927,410 B2 | 8/2005 | Chen | |
| 7,348,620 B2 | 3/2008 | Chiang et al. | |
| 7,485,891 B2 | 2/2009 | Hamann et al. | |
| 7,679,163 B2 | 3/2010 | Chen et al. | |
| 7,701,749 B2 | 4/2010 | Jeong et al. | |
| 7,705,424 B2 | 4/2010 | Lee et al. | |

(Continued)

FOREIGN PATENT DOCUMENTS

| | | |
|---|---|---|
| CN | 101267016 A | 9/2008 |
| EP | 2891182 B1 | 7/2018 |

(Continued)

OTHER PUBLICATIONS

Cheng et al., "Phase Change Memory With Conductive Rings," U.S. Appl. No. 17/449,515, filed Sep. 30, 2021.

(Continued)

*Primary Examiner* — Marvin Payen
(74) *Attorney, Agent, or Firm* — Kimberly Zillig

(57) ABSTRACT

A heater, a system, and a method for linearly changing the resistance of the phase change memory through a graded heater. The system may include a phase change memory. The phase change memory may include a dielectric. The phase change memory may also include a heater patterned on the dielectric, the heater including: an outside conductive heating layer that has a higher resistance than other layers of the heater, and an inside conductive heating layer that has a lower resistance than the outside conductive heating layer, where the outside conductive heating layer is at an outside area of the heater and the inside conductive heating layer is at an inside area of the heater. The phase change memory may also include a phase change material proximately connected to the heater. The phase change memory may also include a top electrode proximately connected to the phase change material.

19 Claims, 12 Drawing Sheets

(56) References Cited

U.S. PATENT DOCUMENTS

| | | |
|---|---|---|
| 7,778,079 B2 | 8/2010 | Jeong et al. |
| 7,932,507 B2 | 4/2011 | Chen et al. |
| 8,187,946 B2 | 5/2012 | Karpov et al. |
| 8,199,567 B2 | 6/2012 | Chang-Wook et al. |
| 8,471,236 B2 | 6/2013 | Breitwisch et al. |
| 8,648,326 B2 | 2/2014 | Breitwisch et al. |
| 8,921,817 B2 | 12/2014 | Son |
| 9,099,637 B2 | 8/2015 | Song |
| 9,166,161 B2 | 10/2015 | BrightSky et al. |
| 9,178,138 B2 | 11/2015 | Tan et al. |
| 9,190,265 B2 | 11/2015 | Liu et al. |
| 9,472,274 B1 | 10/2016 | Lung |
| 9,558,823 B1 | 1/2017 | Khwa et al. |
| 10,050,194 B1 | 8/2018 | Nardi et al. |
| 10,056,546 B2 | 8/2018 | BrightSky et al. |
| 10,141,503 B1 | 11/2018 | BrightSky et al. |
| 10,374,010 B2 | 8/2019 | Wu |
| 10,707,417 B1 | 7/2020 | Bruce et al. |
| 10,991,879 B2 | 4/2021 | Ruiz et al. |
| 2007/0274121 A1 | 11/2007 | Lung et al. |
| 2008/0061282 A1 | 3/2008 | Sato et al. |
| 2008/0116437 A1 | 5/2008 | Oh et al. |
| 2018/0205017 A1 | 7/2018 | Bruce et al. |
| 2019/0123103 A1* | 4/2019 | Wu .................. G11C 13/0004 |
| 2021/0091307 A1 | 3/2021 | BrightSky et al. |

FOREIGN PATENT DOCUMENTS

| | | |
|---|---|---|
| JP | 5020045 B2 | 9/2012 |
| KR | 100849485 B1 | 7/2008 |
| KR | 1020170022423 A | 3/2017 |
| TW | I476770 B | 3/2015 |

OTHER PUBLICATIONS

Updated List of IBM Patents or Patent Applications Treated as Related, Dated Apr. 29, 2022, 2 pages.

Kim et al., "A Phase Change Memory Cell with Metallic Surfactant Layer as a Resistance Drift Stabilizer," IEEE, Printed Sep. 29, 2021, 4 pages.

Wong et al., "Phase Change Memory," IEEE, Proceedings of the IEEE, vol. 98, No. 12, Dec. 2010, 27 pages.

Ryoo-etal, "Ring Contact Electrode Process for High Density Phase Change Random Access Memory" Japanese Journal of Applied Physics, vol. 46, No. 4B, 2007, pp. 2001-2005.

Tuma et al., "Stochastic phase-change neurons," nature nanotechnology, Published Online: May 16, 2016 | DOI: 10.1038/NNANO.2016.70, 8 pages.

Chawla et al., "Effective electron mean free path in TiN(001)," Journal of Applied Physics 113, 2013, 7 pages.

List of IBM Patents or Patent Applications Treated as Related, Dated Jun. 22, 2021, 2 pages.

Cheng et al., "Phase Change Memory With Concentric Ring-Shaped Heater," U.S. Appl. No. 17/358,223, filed Jun. 25, 2021.

* cited by examiner

PHASE CHANGE MEMORY WITH GRADED HEATER

BACKGROUND

The present disclosure relates to phase change memory and, more specifically, to linearly changing the conductance of the phase change memory through a graded heater within the phase change memory.

Phase change memory (PCM) is a non-volatile random access memory (NVRAM). PCMs contain phase-change materials (such as alloys containing Tellurium) and may alter the states (e.g., crystalline and amorphous phases) of the PCM using heat. The phase-change materials may be placed between two electrodes, and when the phase-change materials are in a crystalline state the phase-change materials have a high conductivity and a low resistivity (which corresponds to a logical 1), allowing current to travel quickly thorough the phase-change materials and between electrodes. When the phase-change materials are in an amorphous state the materials have a low conductivity and a high resistivity (which corresponds to a logical 0), preventing current from travelling quickly through the phase-change materials and between the electrodes. The portions of the phase-change material that are amorphous and crystalline may be controlled to achieve intermediate conductivity values, for use in analog computing. The data is stored using the contrast between resistances of the multiple states. The PCM is a non-volatile memory, as the states can remain if/when power is removed, allowing PCMs to retain data even when there is no power.

SUMMARY

The present invention provides a graded heater, a system, and a method of linearly changing the conductance and resistance of the phase change memory through a graded heater. The graded heater may include an outside conductive heating layer that has a higher resistance than other layers of the heater. The graded heater may also include an inside conductive heating layer that has a lower resistance than the outside conductive heating layer, where the outside conductive heating layer is at an outside area of the heater and the inside conductive heating layer is at an inside area of the heater.

The system may include a phase change memory. The phase change memory may include a dielectric. The phase change memory may also include a heater patterned on the dielectric, the heater including: an outside conductive heating layer that has a higher resistance than other layers of the heater, and an inside conductive heating layer that has a lower resistance than the outside conductive heating layer, where the outside conductive heating layer is at an outside area of the heater and the inside conductive heating layer is at an inside area of the heater. The phase change memory may also include a phase change material proximately connected to the heater. The phase change memory may also include a top electrode proximately connected to the phase change material.

The method of forming a phase change memory may include etching a heater via in a dielectric. The method may also include conformally depositing a metal, resulting in a first conductive heating layer. the method may also include repeating conformal deposition of lower resistance metals, where each deposition includes a lower resistance metal, resulting in a plurality of graded conductive heating layers graded from high resistance to low resistance, where the plurality of graded conductive heating layers includes the first conductive heating layer. The method may also include removing excess material from the plurality of graded conductive heating layers. The method may also include depositing a phase change material and a top electrode.

The above summary is not intended to describe each illustrated embodiment or every implementation of the present disclosure.

BRIEF DESCRIPTION OF THE DRAWINGS

The drawings included in the present application are incorporated into, and form part of, the specification. They illustrate embodiments of the present disclosure and, along with the description, serve to explain the principles of the disclosure. The drawings are only illustrative of certain embodiments and do not limit the disclosure.

Figure 1A:
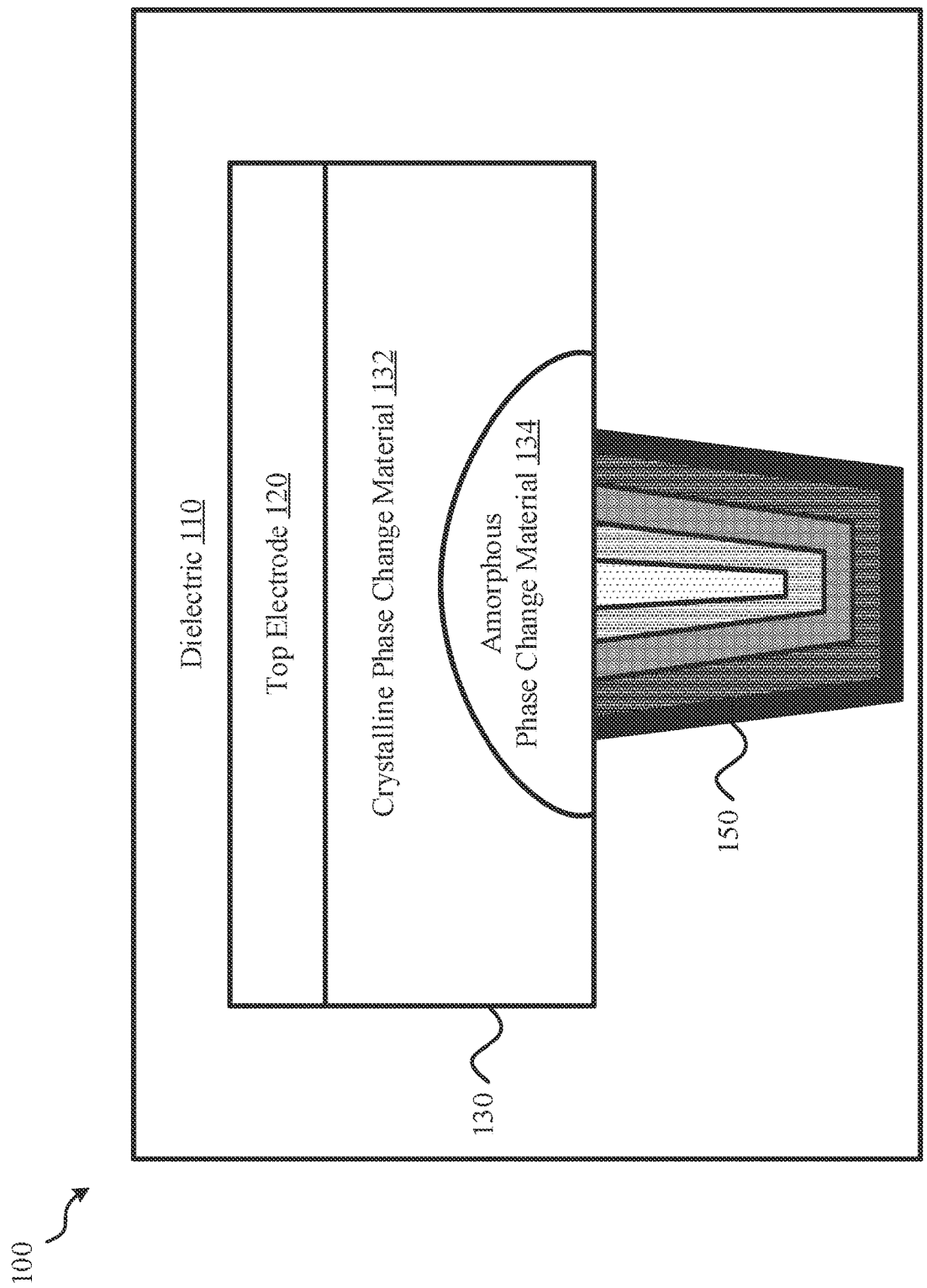
FIG. 1A depicts a schematic diagram of a first exemplary phase change memory with a graded heater, according to some embodiments.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention.

DETAILED DESCRIPTION

Aspects of the present disclosure relate to phase change memory and, more specifically, to linearly changing the conductance of the phase change memory through a graded heater within the phase change memory. While the present disclosure is not necessarily limited to such applications, various aspects of the disclosure may be appreciated through a discussion of various examples using this context.

A phase change memory (PCM) may include a bottom electrode and a top electrode with a phase change material between the two. As discussed above, conventional phase change memories (PCMs) and their corresponding phase change materials have two states—amorphous and crystalline. The amorphous state may be referred to as a RESET state and the crystalline state may be referred to as a SET state. To switch the phase change material between the two states, the PCM may also include a heater (sometimes called the bottom electrode and/or the bottom electrode contact) that sends current pulses through the heater and into the phase change material. In some embodiments, the heater is the bottom electrode. In some embodiments, the heater is patterned on top of the bottom electrode.

When the phase change material is in a crystalline state, the heater may convert the material into an amorphous state by sending short high current pulses to rapidly heat the phase change material and then quenching or cooling it. When the phase change material is in an amorphous state, the heater may convert the material into a crystalline state by sending a longer, but lower current, pulse(s) to heat the phase change material to a crystallization temperature for a prolonged period of time (without cooling the material) to allow for the material to become crystalline.

When the phase change material (of the phase change memory) is in an amorphous state (or a RESET state), the phase change material may have a high resistivity and a low conductivity (i.e., high electrical resistivity and low electrical conductivity), and current may not travel quickly through the phase change material. Alternatively, when the phase change material is in a crystalline state (or a SET state), the phase change material may have a low resistivity and a high conductivity (i.e., low electrical resistivity and high electrical conductivity), and current may travel quickly through the phase change material. The data may be stored in the phase change memory (PCM) using the contrast between the resistances of the two states (or phases). Further, each state may correspond to a binary value, with an amorphous state corresponding to a 0 and a crystalline state corresponding to a 1. PCM has many benefits, such as increased speeds (compared to other types of memory), non-volatile capabilities, less power requirements, etc., however, conventional PCMs may have abrupt changes between the phases, particularly at the amorphous state (i.e., an abrupt change to the RESET state).

Resistance, as referred to herein, may be an electrical resistance, and may refer to the opposition of current flow through an object. Resistivity, as referred to herein, may be an electrical resistivity, and may refer to the resistance (i.e., electrical resistance) per unit area of an object and/or material. Resistivity may, for example, be calculated using the magnitude of the electric field and the magnitude of the current density (i.e., the magnitude of the electric field divided by the magnitude of the current density). Resistance may be calculated, for example, by multiplying the resistivity by the length of the object and/or material and dividing by the cross-sectional area of the object and/or material. When resistivity remains constant, the resistance of an object can be changed by changing the length, width, etc. of the object. For example, a titanium nitride (TiN) material may have different amounts of resistance depending on the length, width, etc. of the TiN object, however the resistivity of TiN does not change due to changes in the dimensions of the object formed by the TiN.

Similarly, conductance, as referred to herein, may be an electrical conductance, and may refer to the ease of current flow through an object (i.e., how easily current flows through an object). Conductivity, as referred to herein, may be an electrical conductivity, and may refer to the conductance (i.e., electrical conductance) per unit area of an object and/or material. When conductivity remains constant, the conductance of an object can be changed by changing the length, width, etc. of the object. Resistivity and conductivity are intrinsic properties, whereas resistance and conductance are extrinsic properties.

In PCMs, when current travels through the heater, heat is generated (for instance, through the Joule heating effect) and the heat can change the phase of the phase change material from a crystalline to an amorphous phase (or vice versa, depending on the amount of heat and whether there is a quench). Therefore, the greater the electrical conductance or the lesser the electrical resistance (referred to herein as conductance and resistance, respectively), the greater the flow of current (at a particular voltage) traveling through the heater and the greater the amount of heat generated from the flowing current.

In some instances, phase change memories are designed so that there is a switching zone, commonly referred to as a mushroom cell, where the phase change material first starts to change phase (e.g., from crystalline to amorphous, or vice versa). This zone may form as a dome shape similar to a top of a mushroom, in some instances. However, the formation and growth of the mushroom cell and the change in conductance of the phase change material may conventionally be a non-linear change. For instance, the mushroom cell may initially exhibit a very quick formation and growth once it is exposed to the current and heat from the heater (for example, when the top of the heater is uncovered). This may result in a large, sharp jump in conductance or resistance when the phase change material first starts changing its phase and forming the mushroom cell. For example, the phase change material may be in a crystalline state and when it starts changing state, the mushroom cell of amorphous material may form quickly and grow rapidly, at first. Once the phase change material has been exposed to the heater for a period of time, the conductance or resistance may start having a slow, non-linear change (as opposed to the initial quick spike). Put differently, the rate of change (when changing from one phase to another) slows over time and the growth of the mushroom cell slows.

PCM has many possible applications, such as analog computing, cognitive computing, neuromorphic applications, etc. However, in various applications, it may be desired to have a phase change material with a more gradual and linear change between the states. This allows for a greater control of the PCM and its states. Further, in some instances, PCMs are used for inference. When used for inference, an array of PCMs may be formed, each PCM may be tuned to a resistance value, and the matrix of analog resistance states and various inputs may be used to calculate outputs. When a PCM is used for inference, there may need to be high resolution of resistance states between SET (i.e., crystalline) and RESET (i.e., amorphous) and for training there may need to be linearity in conductance. A more gradual and linear change in state for the PCM may improve both resolution and linearity. For instance, conventional PCMs may abruptly change between crystalline and amorphous states, however the gradual and linear transition between the states and their corresponding conductance values may accelerate both multiply and accumulate operations as well as achieve a symmetrical (and gradual) long-term depression and long-term potentiation (which may be very beneficial for PCM applications such as cognitive computing, neuromorphic applications, etc.). In conventional PCMs, it may be difficult to linearly increase and decrease the conductance of the PCM as at least the RESET phase (i.e., changing to the amorphous state) is typically very abrupt.

The present disclosure provides a graded heater, a system, and a method of linearly changing the conductance and resistance of the phase change memory through a graded heater. The heater may have multiple conductive layers (for example, layers of metals) going from higher resistance to lower resistance. The layer with the highest resistance may be the outside layer (i.e., the layer at the outside area of the heater), then the layers may continue decreasing resistance (and increasing conductance), with the inside layer (i.e., the layer at the inside/core area of the heater) having the lowest resistance of all the layers. In some embodiments, the resistance of each layer is determined using the resistivity of each layer. In some embodiments, the resistance of each layer is determined using the contact resistance of each layer.

In some instances, one or more of the layers may be different metals with different resistivities, and the metals may be arranged in thin layers of decreasing resistivity (e.g., from out to in). For example, an outside layer may be nitrogen-rich tantalum nitride (TaN), followed by tantalum-rich TaN, followed by nitrogen-rich titanium nitride (TiN), followed by titanium-rich TiN, followed by titanium, etc. In some instances, one or more of the layers may be a same metal but differing compositions of the components of the metal. The different compositions may result in different resistivities of each layer. For example, an outside layer may start with TiN with a high nitrogen content, and the nitrogen percentage may continue decreasing (with the lowest nitrogen percentage at the inside core of the layers) as it is being deposited.

By including layers of differing resistances and arranging the layers so that the heater has a highest resistance at the outside layers (at an outside area of the heater) and a lowest resistance at the inside layers (at an inside area of the heater)—with the resistances going from high resistance to low resistance, the formation of the mushroom cell in the phase change material is more gradual as the heater has different resistances and/or resistivities in different areas of the heater. If the heater were made of all the same material with the same resistance, then the phase change material may be exposed to a larger amount of heat as soon as current starts being transmitted through the heater. However, when the heater includes layers of differing resistances and/or resistivities, different amounts of heat are generated based on the current flowing through each layer and reaching the phase change material. In addition, by arranging the layers in an order from high resistance to low resistance, the phase change of the phase change material (for example, the formation of the mushroom cell) is more linear due to the structure and order of the rings.

Referring now to FIG. 1A, a first exemplary phase change memory 100 with a graded heater 150 is depicted, according to some embodiments. FIG. 1A presents a cross-sectional view of a phase change memory 100. Phase change memory 100 includes a heater 150, a phase change material 130, a top electrode 120, and a dielectric 110 encapsulating the other components. In this instance, the heater 150 is the bottom electrode of the phase change memory 100. However, in other embodiments (not depicted), a bottom electrode may be below, and proximately connected to, the heater 150, and the bottom electrode may send current through the heater 150. Heater 150 is proximately connected to phase change material 130 and phase change material 130 is proximately connected to top electrode 120.

As used herein, the term "proximately connected" describes a connection between two components in relation the remainder of one of those components. For example, heater 150 can be described as proximately connected to the bottom end of phase change material 130 as compared to the top end of the phase change material 130 because heater 150 is connected more directly to the bottom end of phase change material 130 than the top end. Thus, even though heater 150 may have an electrical connection to both the top and bottom ends of phase change material 130, heater 150 is more directly connected to the bottom portion of phase change material 130 that the top portion of phase change material 130. By this reasoning, therefore, heater 150 is proximately connected to the bottom portion of phase change material 130, as illustrated.

The phase change memory 100 may send electrons and currents back and forth between the heater 150 and the top electrode 120, ultimately sending the currents into the phase change material 130, which may alter its state (i.e., to an amorphous state and/or crystalline state). The phase change material 130 is a material that is able to change from a crystalline phase to an amorphous phase and vice versa. Example phase change materials 130 include germanium-antimony-tellurium (or $Ge_2Sb_2Te_5$, referred to herein as GST), $GeTe/Sb_2Te_3$, or any other alternative materials.

The heater 150 may expose the phase change material 130 to current transmitted through the heater at the contact point between the heater 150 and the phase change material 130 and may concentrate the current (and heat exposure) at the contact point. This may form a mushroom cell, starting at the contact point, when the phase of the phase change material 130 begins changing. In phase change memory 100, the phase change material was initially in a crystalline state (shown by crystalline phase change material 132), and has started changing into an amorphous state (shown by amorphous phase change material 134) due to generated heat from current travelling through heater 150. The amorphous phase change material 134 is a mushroom cell where the phase change material has started changing from a crystalline state to an amorphous state. The mushroom cell (i.e., amorphous phase change material 134) may continue growing and expanding as current continues to travel through the heater 150. This may result in a linear change of the phase change material 130 from a crystalline phase change material 132 to an amorphous phase change material 134.

Figure 1B:
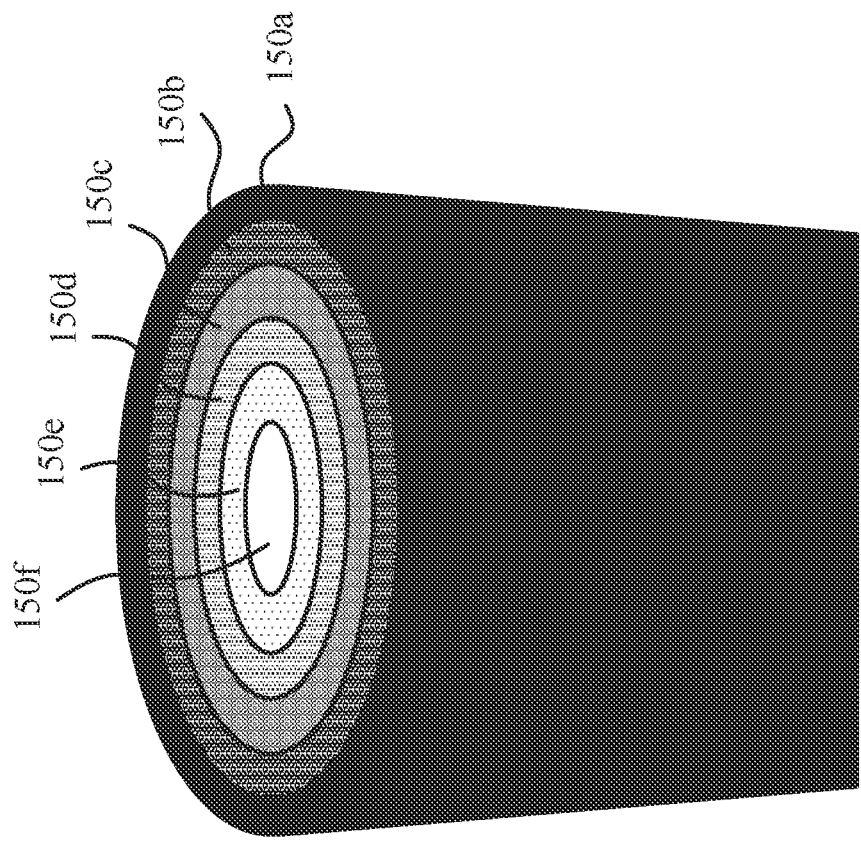
FIG. 1B depicts a schematic diagram of a second view of the graded heater, according to some embodiments.

Referring to FIG. 1B, a second viewpoint of the graded heater 150 is depicted, according to some embodiments. As depicted in both FIG. 1A and FIG. 1B, the heater has different layers with different resistances. FIG. 1B gives a more top down view of the different layers of the heater 150 and their concentric ring-shape. In FIG. 1B, the layers are very distinct to help clearly show each layer. However, in some instances, these layers may merge together and may be less distinct. For example, the layers could be distributed through a continuous distribution of TiN, with the amount of nitrogen concentration being reduced as distribution continues. In this example, the heater (e.g., heater 150) has a general trend of high resistance TiN at an outside of the heater and low resistance TiN at a center (e.g., core) of the heater, however as the distribution was continuous, there may not be distinct layers. Therefore, although graded heater 150 is referred to as having multiple layers, these layers may be continuously distributed layers and may not be distinct layers.

Heater 150 has an outside layer 150a (at an outside area of the heater 150) with a highest resistance (compared to the other layers). Layer 150b has a lower resistance than layer 150a but a higher resistance than layer 150c. Layer 150c has a lower resistance than 150b but a higher resistance than 150d. Layer 150d has a lower resistance than 150c but a higher resistance than 150e. Layer 150e has a lower resistance than 150d but a higher resistance than 150f. Layer 150f has a lower resistance than 150e and has the lowest resistance of all the layers. Layer 150f is the inside layer of the heater 150 at an inside area of the heater 150. As depicted in FIG. 1B, the higher the resistivity the darker the layer. Similarly, unless otherwise noted, the resistivity of the layers illustrated in the figures of this disclosure increases as the darkness of those layers increases.

As depicted in FIG. 1B, the layers may be radially graded from high resistance (on an outside layer 150a of the heater 150) to low resistance (on an inside layer 150b of the heater 150). The radial ordering of resistance for the layers may be referred to as radially graded conductive heating layers.

Figure 2:
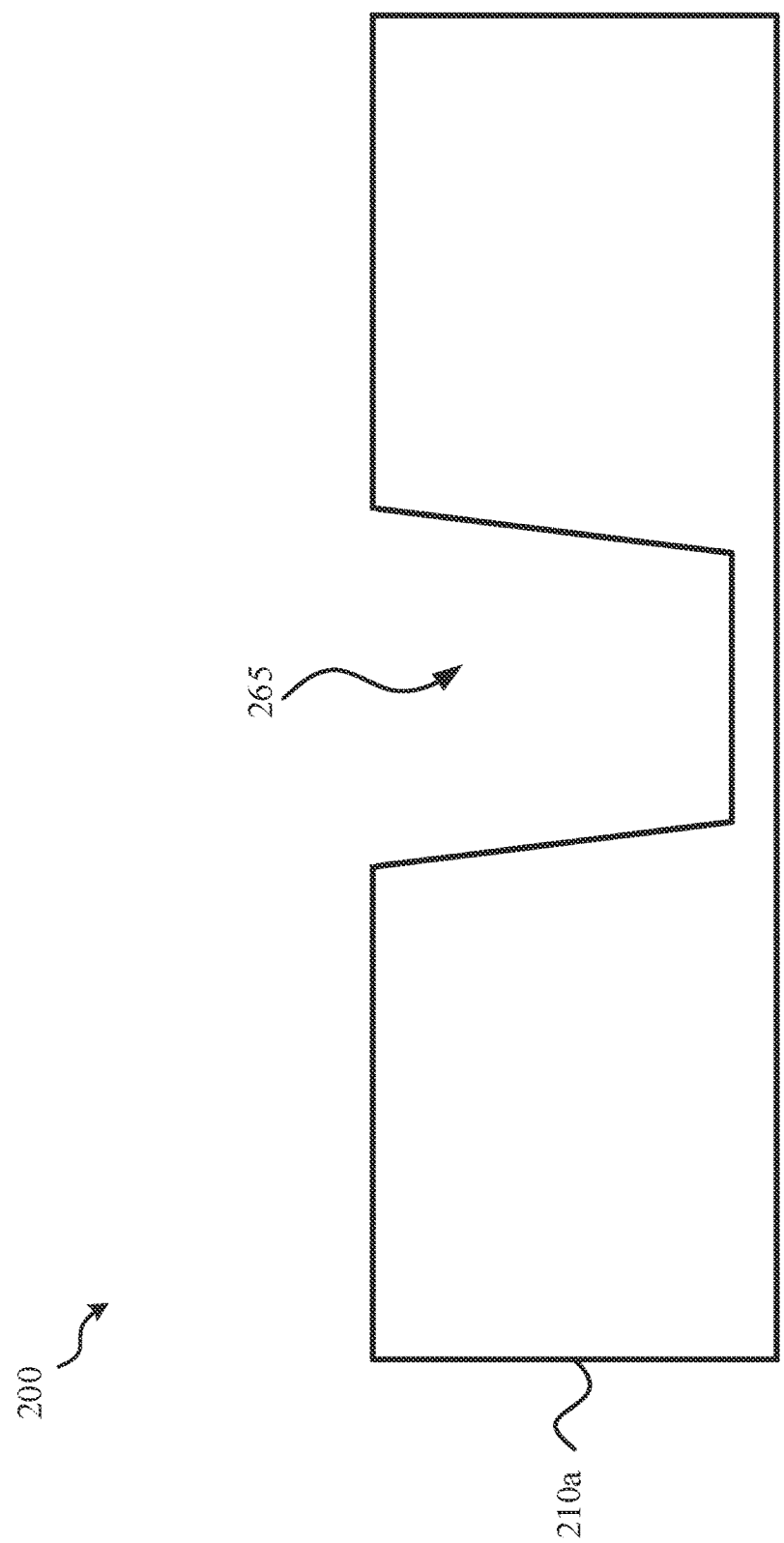
FIG. 2 depicts a schematic diagram of a first intermediate step of creating a via opening for the heater, according to some embodiments.
Figure 5:
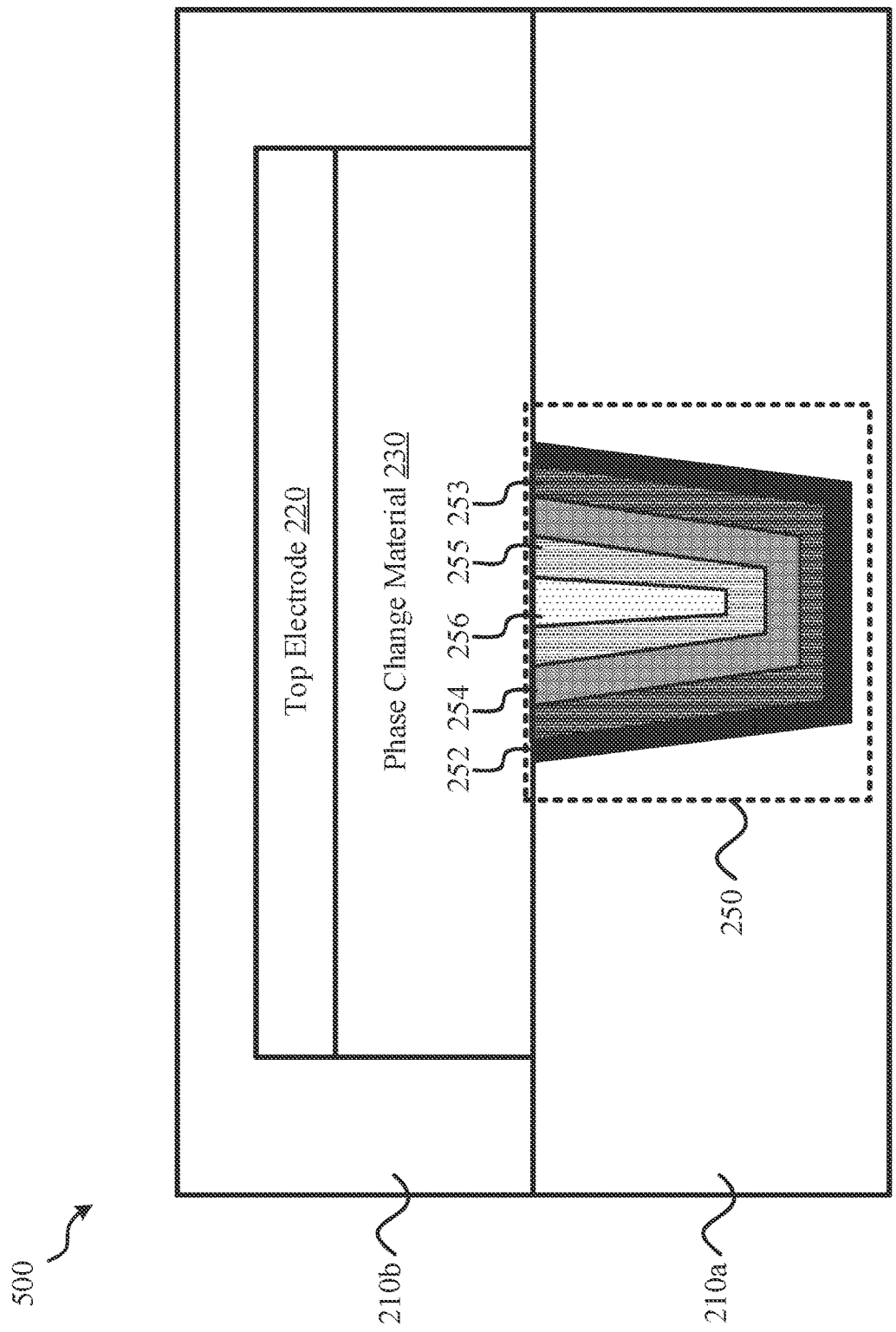
FIG. 5 depicts a schematic diagram of the formed phase change memory, according to some embodiments.

Referring to FIG. 2, a first intermediate step 200 of creating a via opening for the heater is depicted, according to some embodiments. In some instances, intermediate step 200 is the first step of creating phase change memory 100 (FIG. 1A) and/or phase change memory 500 (FIG. 5). In first intermediate step 200, a dielectric 210a is obtained and/or deposited. The dielectric may protect the heater (for example, heater 150 (FIGS. 1A and 1B)) and prevent any other components of the computer system (i.e., outside of the PCM) from being exposed to the current/heat from the heater. As an example, the dielectric 210a may be a low-k dielectric. In some embodiments, dielectric 210a may be made up of silicon nitride (SiN), silicon dioxide (SiO$_2$), or any other dielectric material.

To start forming the heater portion of the PCM, a via 265, or opening, is created in the dielectric 210a. Via 265 may be referred to as heater via 265 as the via/opening is created to make room for the heater. The dielectric 210a is etched and/or patterned to create heater via 265 so that there is an opening for the conductive layers to be deposited in later steps.

Figure 3:
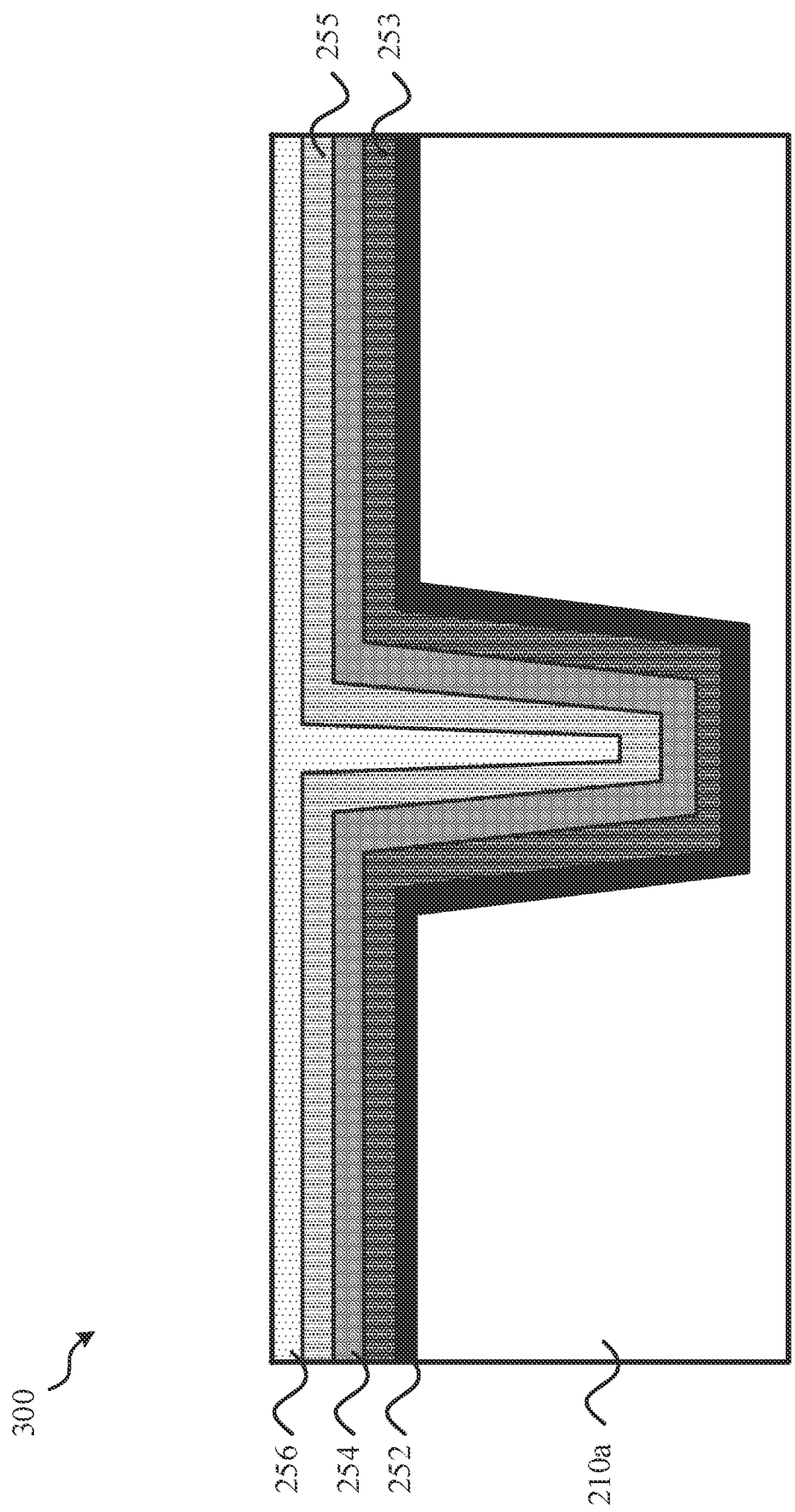
FIG. 3 depicts a schematic diagram of a second intermediate step of depositing each conductive heating layer, according to some embodiments.

Referring to FIG. 3, a second intermediate step 300 of depositing each conductive heating layer is depicted, according to some embodiments. First, a conductive heating layer 252 with a high resistance may be deposited. As discussed herein, the highest resistance layer (layer 252) may be the outside layer (i.e., the layer that is first deposited) and the remaining layers may decrease resistance. In FIG. 3, conductive heating layers 252, 253, 254, 255, and 256 are depicted, ranging from a high resistance to a low resistance, respectively. In this method of deposition, conductive heating layer 252 goes across a bottom of the via 265, with the other layers layered on top. Therefore, current may travel through conductive heating layer 252 before reaching 253, through 253 before reaching 254, 254 before reaching 255, and 255 before reaching 256. Although five conductive heating layers are depicted, the heater may include any plurality of heating layers.

In some embodiments, each layer 252-256 is conformally deposited (i.e., deposited through conformal deposition) so that each layer takes the shape of the heater via 265 (FIG. 2)— or what remains of the heater via 265 after the previous layer has been deposited. In some embodiments, each layer 252-256 may be deposited through a cyclic deposition (and, in some instances, a cyclic conformal deposition). A cyclic deposition deposits the material in a circle and/or closed curve, such that each layer is its own closed curve. By using cyclic deposition techniques to deposit each layer, each layer may form a concentric ring-shape.

Deposition techniques such as atomic layer deposition (ALD), chemical vapor deposition (CVD), and/or laser induced chemical vapor disposition (LCVD) may be used to deposit the conductive heating layers 252-256. In some embodiments, each layer may be deposited individually.

Figure 4:
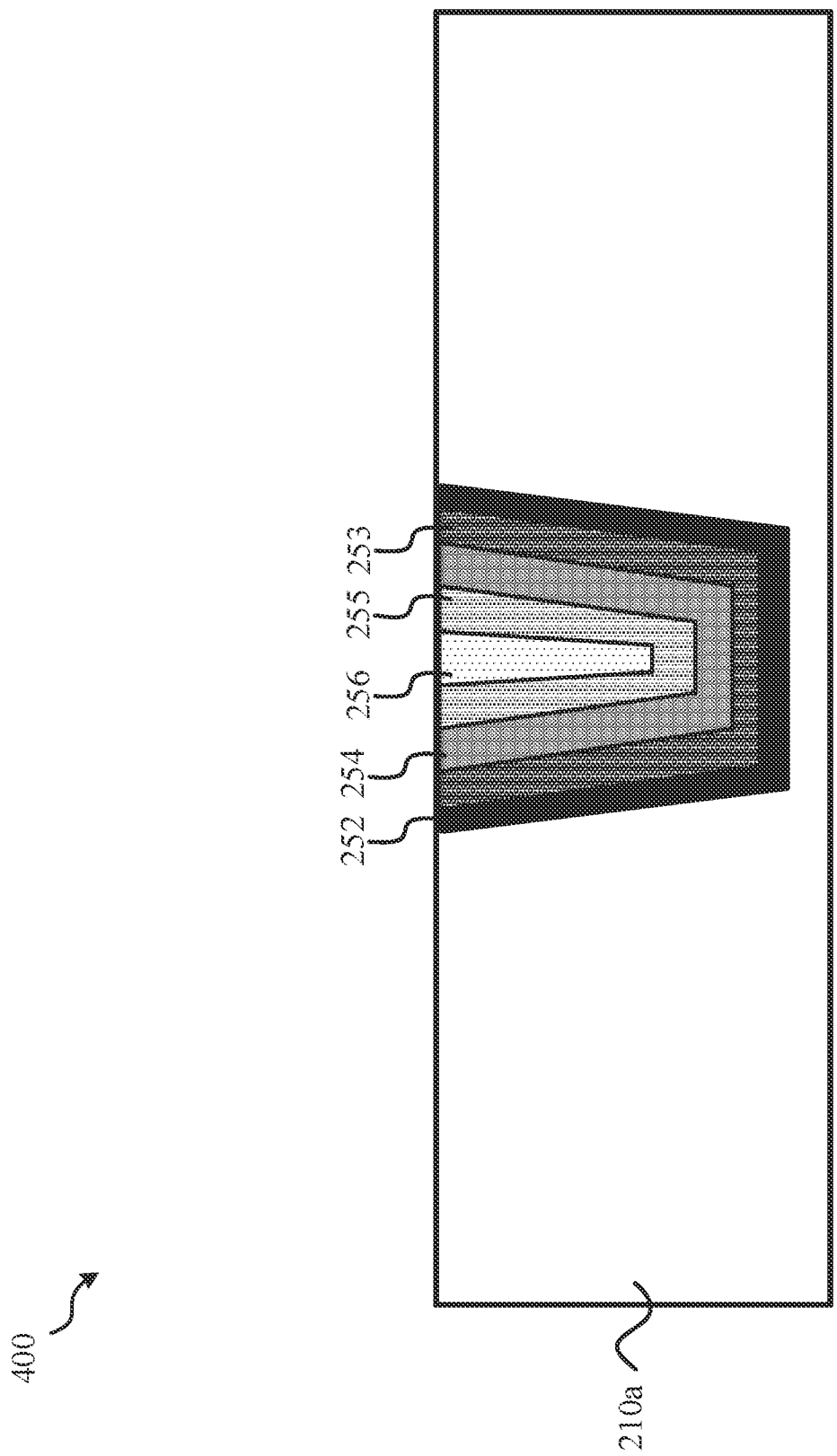
FIG. 4 depicts a schematic diagram of a third intermediate step of removing excess portions of conductive heating layer, according to some embodiments.

Referring to FIG. 4, a third intermediate step 400 of removing excess portions of conductive heating layer is depicted, according to some embodiments. Once the layers have been deposited in intermediate step 300 (FIG. 3) in order of resistance, the excess portions of the conductive heating layers 252-256 may be removed so that the dielectric 210a is exposed and the heating layers 252-256 are contained within the via 265 formed in intermediate step 200 (FIG. 2). This way, as discussed above, the phase change material's exposure to current and heat is limited to the contact area between the layers 252-256 and the phase change material (depicted in FIG. 5).

To remove the excess portions of the conductive heating layers 252-256, the layers may be etched such that the top of each layer is level with the dielectric 210a. In some embodiments, the etching of the excess portions of the conductive heating layers 252-256 may be executed using reactive-ion etching (RIE).

Referring to FIG. 5, the formed phase change memory 500 is depicted, according to some embodiments. Once the excess portions of the conductive heating layers 252-256 are removed and the layers are contained within the via 265 created in FIG. 2, a phase change material 230 is deposited on top of the heater 250 and a top electrode 220 is deposited on top of the phase change material 230. The conductive layers 252-256 may be referred to, together, as heater 250. In some embodiments, the phase change material 230 is GST or a comparable phase change material.

As discussed herein, ordering or grading the layers from high resistivity to low resistivity allows the phase change material 230 to be exposed to heat in a more ordered and linear fashion (due to the layers) and the phase change material's 230 change between phases may be more linear. The heater with ordered/graded layers from high resistivity to low resistivity may be referred to herein as a graded heater.

Once the phase change material 230 and the top electrode 220 are deposited, both components may be encapsulated in dielectric 210b. This allows for the entire phase change memory 500 (e.g., including heater 250, phase change material 230, and top electrode 220) to be encapsulated in dielectric 210a and 210b. In some instances, dielectric 210a and 210b may be referred to as dielectric 210. In some embodiments, dielectric 210a and 210b are the same material. In some embodiments, dielectric 210a and 210b are different materials.

Figure 6:
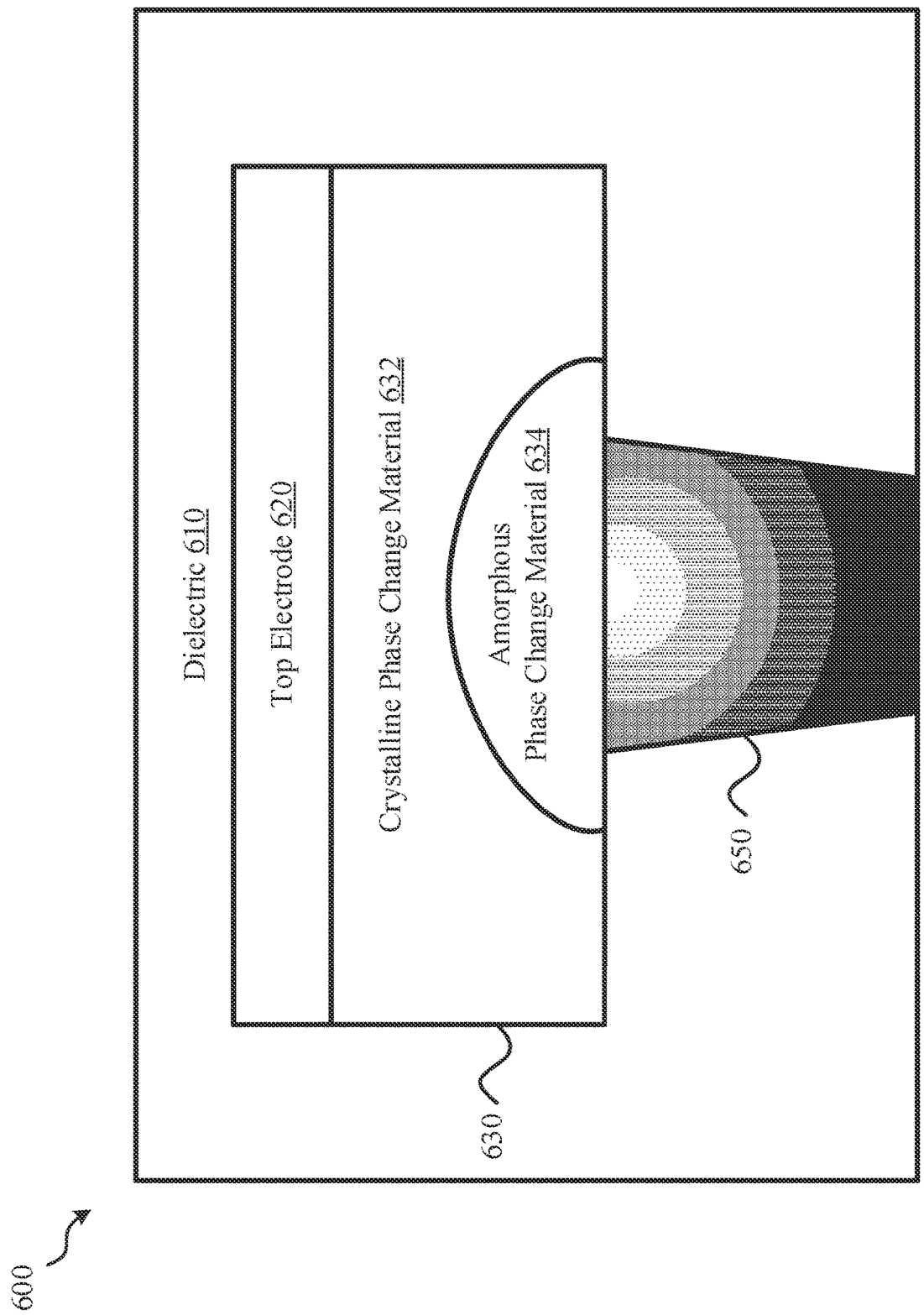
FIG. 6 depicts a schematic diagram of a second exemplary phase change memory, according to some embodiments.

Referring to FIG. 6, a second exemplary phase change memory 600 is depicted, according to some embodiments. Phase change memory 600 may be similar to phase change memory 500 (FIG. 5) and/or phase change memory 100 (FIG. 1), however instead of each layer being deposited individually, the layers may be deposited in a continuous deposition starting from high resistance and decreasing resistance throughout the deposition. In FIG. 6, the darker the color, the higher the resistance. As shown in heater 650, the layers may not be as clear and clean as the layers in phase change memory 500 (FIG. 5) and/or phase change memory 100 (FIG. 1), however there is a general trend of high resistance on an outside of heater 650 and a low resistance at a center of heater 650, with the resistance gradually decreasing from outside to inside/center.

In phase change memory 600, current may have already started travelling through heater 650, therefore phase change material 630 has started changing from a crystalline phase change material 632 to an amorphous phase change material 634 with a mushroom cell (i.e., amorphous phase change material 634) forming above the heater 650.

Figure 7:
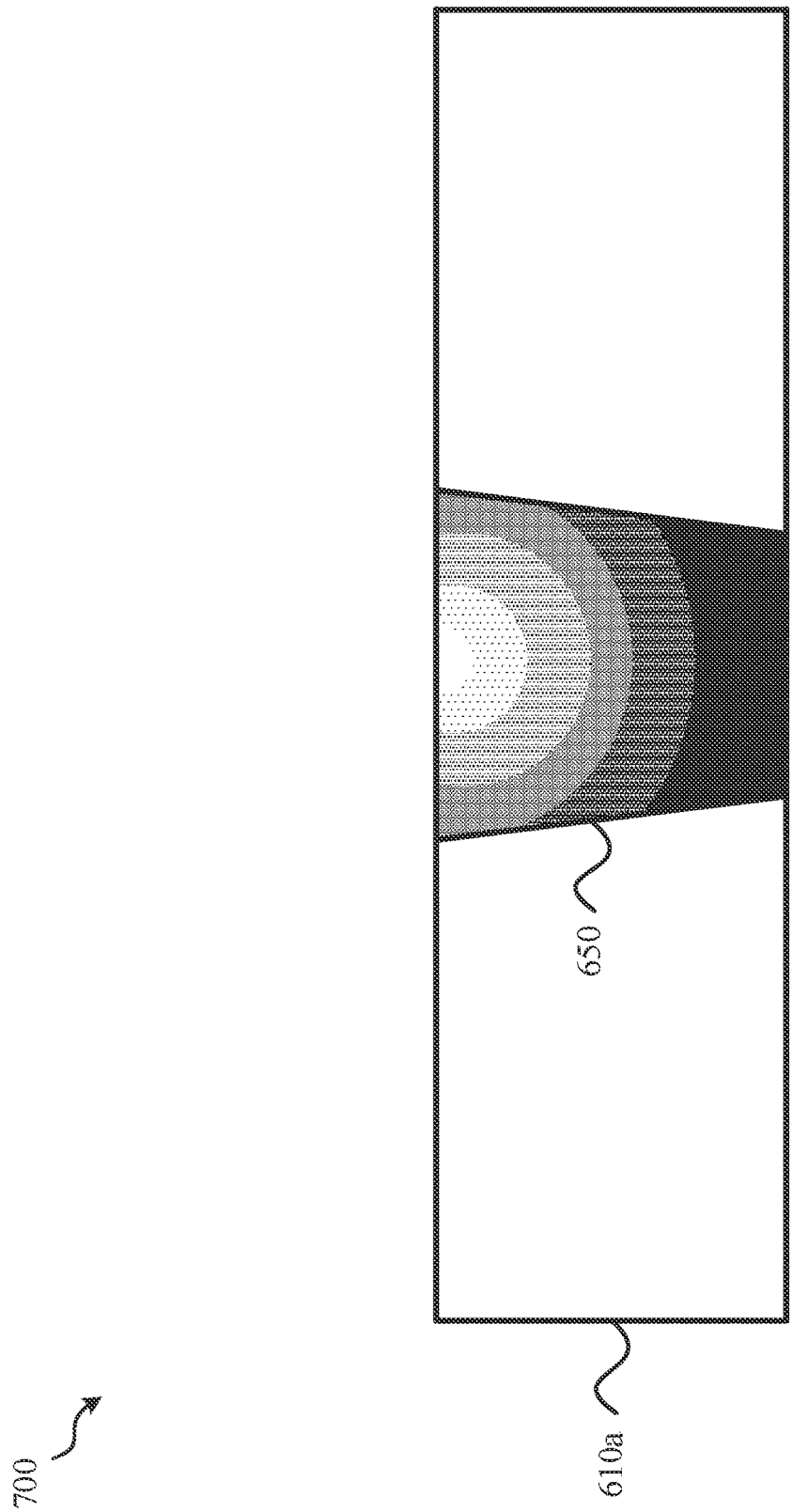
FIG. 7 depicts a schematic diagram of an intermediate step when forming the second exemplary phase change memory, according to some embodiments.

Referring to FIG. 7, an intermediate step 700 when forming the second exemplary phase change memory 600 (FIG. 6) is depicted, according to some embodiments. The dielectric 610*a* may be obtained and/or deposited and a heater via may be created the same way, or a similar way, as discussed in FIG. 2. Further, the layers of heater 650 may be deposited in a similar way as FIG. 3, however the deposition may be a continuous deposition, as opposed to depositing each conductive heating layer individually.

In some instances, this continuous deposition may occur when one or more of the layers may be the same metal but differing compositions of the components of the metal. The different compositions may result in different resistivities of each layer. For example, an outside layer may start with TiN with a high nitrogen content, and the nitrogen percentage may continue decreasing (with the lowest nitrogen percentage at the inside core of the layers) as it is being deposited.

Figure 8:
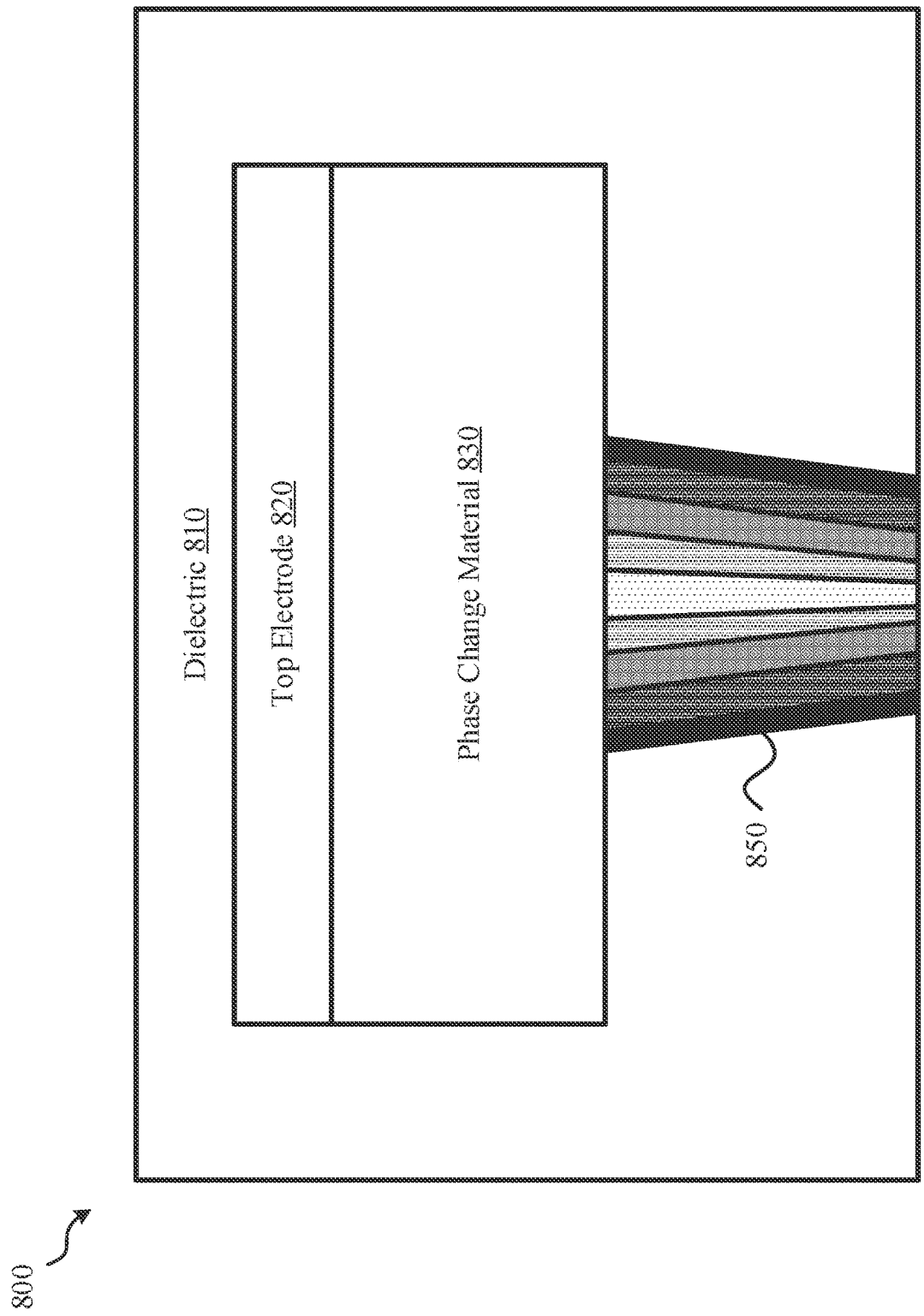
FIG. 8 depicts a schematic diagram of a third exemplary phase change memory, according to some embodiments.

Referring to FIG. 8, a third exemplary phase change memory 800 is depicted, according to some embodiments. Phase change memory 800 may be similar to phase change memory 100 (FIG. 1), phase change memory 500 (FIG. 5), and/or phase change memory 600 (FIG. 6), however phase change memory 800 may expose each layer of heater 850 to a bottom of the heater via (e.g., heater via 165). This allows for current to travel directly through each layer of the heater without having to first travel through other layers of conductive heating layer.

For example, comparing phase change memory 800 to phase change memory 500 (FIG. 5), heater 150 has a high resistance 152 heating layer on both the sides and the bottom of the via 165. Therefore, in this example, if current is transmitted through the heater 150 (FIG. 5) starting from a bottom of the heater 150, the current has to travel through each of the other layers before reaching the low resistance layer 156. This may result in some of the initial current flow being blocked/objected to through the high resistance layers, therefore less current may reach the low resistance layers (e.g., 155 and 156). In phase change memory 800, on the other hand, each conductive heating layer of heater 850 is exposed to a bottom of the heater via (e.g., heater via 165), therefore when current is transmitted starting at a bottom of the heater 850, each layer may be exposed to the initial levels of current flow without the current having first travelled through the other layers of the heater 850. This may allow for more current flow through the low resistance layers, as the current flow was not blocked from high resistance layers before reaching the low resistance layers.

Figure 9:
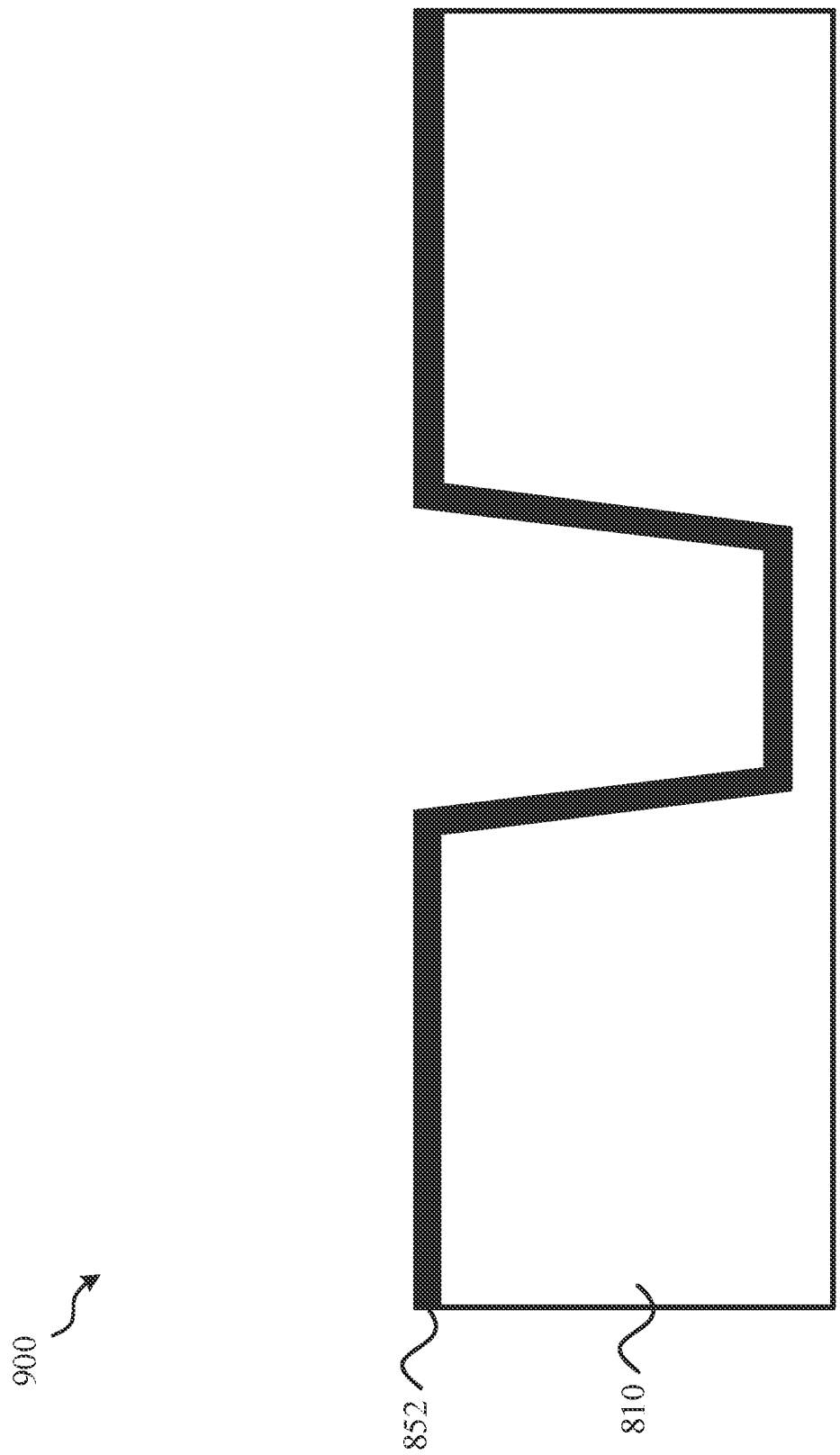
FIG. 9 depicts a schematic diagram of a first intermediate step when forming the third exemplary phase change memory, according to some embodiments.

Referring to FIG. 9, a first intermediate step 900 when forming the third exemplary phase change memory 800 (FIG. 8) is depicted, according to some embodiments. Before reaching intermediate step 900, intermediate step 200 may be performed, as discussed herein. Then, in intermediate step 900, a first conductive heating layer 852 is deposited. Conductive heating layer 852 may be the layer with the highest resistance of the layers. Conductive heating layer 852 may be deposited using the same/similar methods as discussed herein in reference to FIG. 3.

Figure 10:
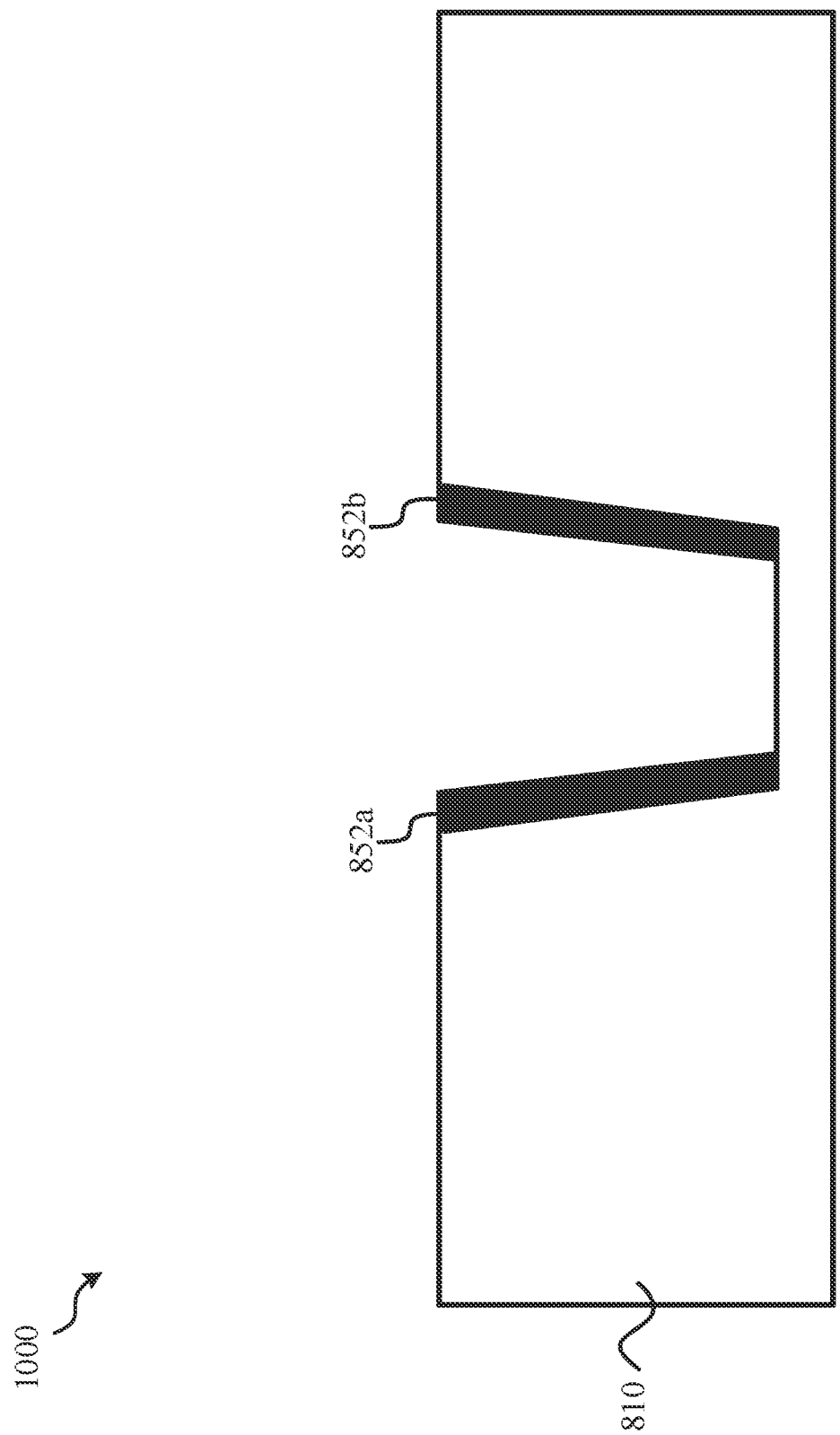
FIG. 10 depicts a schematic diagram of a second intermediate step when forming the third exemplary phase change memory, according to some embodiments.

Referring to FIG. 10, a second intermediate step 1000 when forming the third exemplary phase change memory 800 (FIG. 8) is depicted, according to some embodiments. Because each conductive heating layer has exposure to the bottom of the heater 850 (FIG. 8), the bottom portion of each layer may need to be removed before the next layer can be deposited. In second intermediate step 1000, the excess portions of the conductive heating layer 852 are removed (similar to intermediate step 400 (FIG. 4)) prior to depositing the next conductive heating layer, leaving only portions 852*a* and 852*b* of the conductive heating layer 852. However, in some embodiments, only a bottom portion of conductive heating layer is removed prior to depositing the next layer, and then the excess portions of each heating layer that are above the substrate 810 are all removed after all the layers are deposited, similar to intermediate step 400 (FIG. 4).

In some embodiments, the portions of conductive heating layer 852 are selectively removed through an etchback such as a RIE. In some embodiments, the portions of conductive heating layer 852 are selectively removed using etchback techniques such as buffered oxide etching, hydrogen fluoride etching, phosphoric acid etching, or any other method of etching. The remaining layers of heater 850 (FIG. 8) may be deposited and selectively removed in the same/similar methods.

Once each layer has been deposited and any excess portions of each conductive heating layer have been removed, the phase change material 830 and the top electrode 820 may be deposited as discussed herein. In addition, any remaining components of phase change memory 800 (FIG. 8) may be encapsulated in dielectric 810 such that the entire phase change memory is encapsulated in dielectric 810 to protect it from any other system components, and to protect the other system components from the current and heat of the phase change memory 800.

Figure 11:
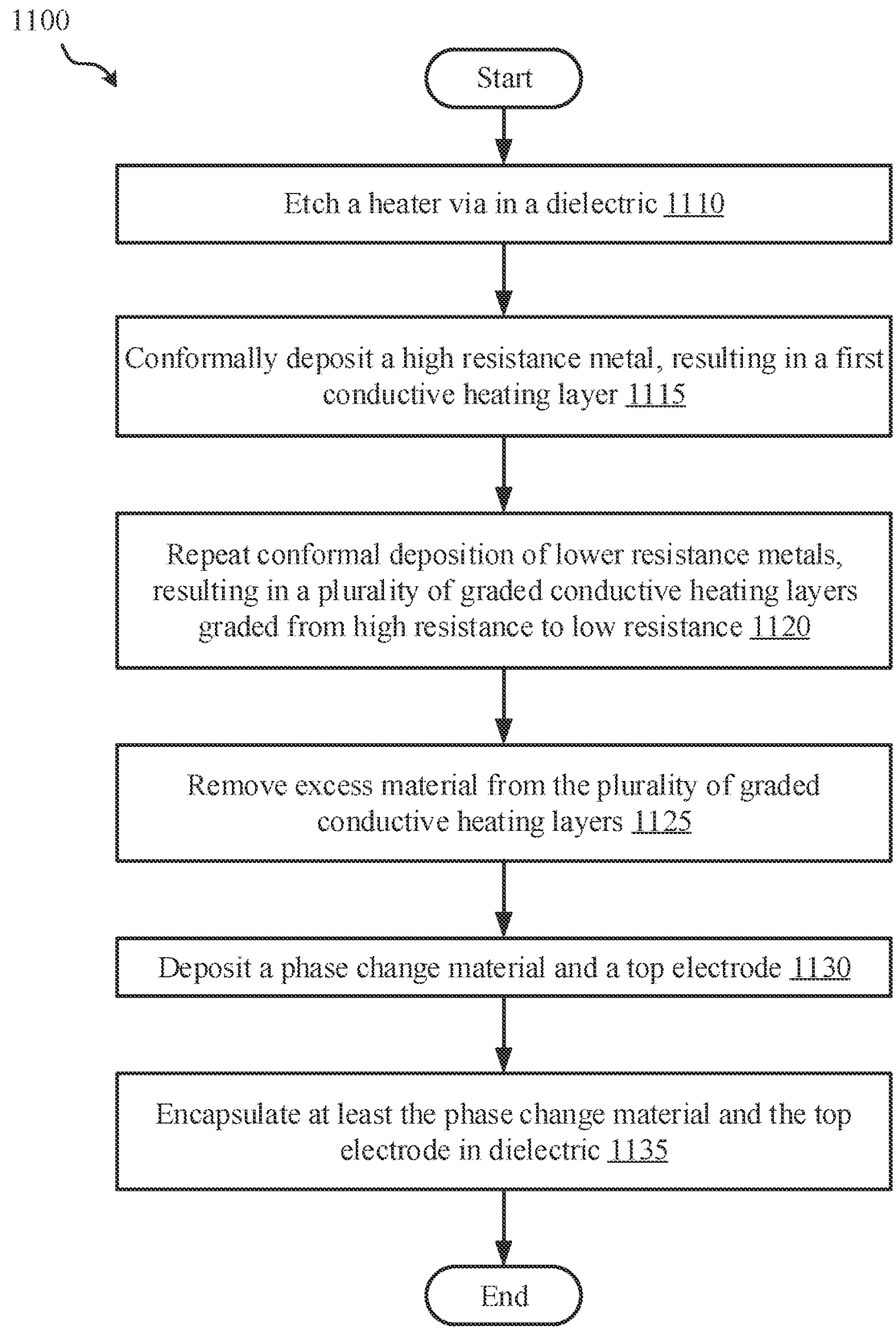
FIG. 11 depicts a flowchart of an exemplary method for forming a phase change memory with a graded heater, according to some embodiments.

Referring to FIG. 11, a flowchart of an exemplary method 1100 for forming a phase change memory with a graded heater is depicted, according to some embodiments.

Method 1100 includes operation 1110 to etch a heater via in a dielectric. This operation may correspond to intermediate step 200 (FIG. 2) and is discussed herein.

Method 1100 includes operation 1115 to conformally deposit a metal. This operation may correspond to intermediate step 300 (FIG. 3), in some instances. In some embodiments, as depicted in FIG. 1 and FIG. 5, each layer of the heater may be deposited individually and may not be deposited in a continuous deposition (as is the case with phase change memory 600 (FIG. 6). In these embodiments, when the phase change memory is similar/the same as phase change memory 100 (FIG. 1) and/or phase change memory 500 (FIG. 5) and each layer is deposited individually, method 1100 may, as depicted, continue to operation 1120 to deposit the remaining conductive heating layers. The remaining conductive heating layers may be deposited by repeating the deposition techniques of the first layer, but with a lesser resistance metal than the first metal. This may continue until each layer is deposited, resulting in graded layers from high resistance to low resistance.

In some embodiments, when each layer of the heater is deposited together as a continuous deposition (and the phase change memory may be similar/the same as phase change memory 600 (FIG. 6)), operations 1115 and 1120 may be a continuous deposition of the conductive heating layers such that there is a graded continuous deposition from high resistance to low resistance.

In some embodiments, as depicted in FIG. 8, the layers of the heater may be individually deposited, however the bottom portions of each layer may be removed prior to the deposition of the next layer. In these embodiments, (for example, when the phase change memory is similar to/the same as phase change memory 800 (FIG. 8)) the bottom portion of the deposited metal (with a higher resistance than the other metal layers) may be removed prior to proceeding to operation 1120. This may correspond to intermediate step 1000 (FIG. 10). Further, in some embodiments (not depicted), method 1100 may proceed to operation 1125 prior to proceeding to operation 1120. Put differently, method 1100 may remove the excess material from the first deposited layer (i.e., the deposited higher resistance metal) (as part of operation 1125) prior to proceeding to operation 1120, and the excess material from each deposited layer may be removed prior to the deposition of the next conductive heating layer.

Method 1100 includes operation 1125 to remove excess material from the plurality of graded conductive heating layers. This operation may correspond to intermediate step 400 (FIG. 4). In some embodiments, this operation may correspond to intermediate step 1000 (FIG. 10). In some instances, such as when operation 1125 corresponds to intermediate step 1000, the excess material may be individually removed following the depositing of that conductive heating layer (for example, by performing an etchback of the excess metal from the conductive heating layer). This way, the excess material from a deposited layer may be removed prior to the depositing of the next layer. In some embodiments, the excess material includes the bottom portion of the deposited layer, such that only the portions of the conductive heating layer that are on the side portions of the heater via remain.

Method 1100 includes operation 1130 to deposit a phase change memory and a top electrode and operation 1135 to encapsulate at least the phase change material and the top electrode in dielectric. These operations may correspond to FIG. 5 and have been discussed further herein. In some instances, once the phase change material and the top electrode are encapsulated in dielectric, the entire phase change memory is encapsulated in the dielectric.

Method 1100 is only one possible method of forming a phase change memory with a concentric ring-shaped heater.

The present invention may be a system, a method, etc. at any possible technical detail level of integration. The flowchart and block diagrams in the Figures illustrate the architecture, functionality, and operation of possible implementations of systems, methods, and computer program products according to some embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present disclosure have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A heater in a phase change memory, the heater comprising:
    an outside conductive heating layer that has a higher electrical resistance than other layers of the heater;
    a first middle conductive heating layer between the outside conductive heating layer and an inside conductive heating layer, the first middle conductive heating layer having a lower electrical resistance than the outside conductive heating layer and a higher electrical resistance than the inside conductive heating layer;
    the inside conductive heating layer that has a lower electrical resistance than the outside conductive heating layer, wherein the outside conductive heating layer is at an outside area of the heater and the inside conductive heating layer is at an inside area of the heater; and
    a second middle conductive heating layer between the first middle conductive heating layer and the inside conductive heating layer, the second middle conductive heating layer having a lower electrical resistance than the first middle conductive heating layer and a higher electrical resistance than the inside conductive heating layer.

2. The heater of claim 1, wherein the outside conductive heating layer has a higher electrical resistivity and the inside conductive heating layer has a lower electrical resistivity, resulting in the higher electrical resistivity at the outside area of the heater and the lower electrical resistivity at the inside area of the heater.

3. The heater of claim 1, wherein the outside conductive heating layer has a greater contact resistance and the inside conductive heating layer has a lesser contact resistance, resulting in the greater contact resistance at the outside area of the heater and the lesser contact resistance at the inside area of the heater.

4. The heater of claim 1, wherein the outside conductive heating layer is a nitrogen-rich TaN layer, the first middle conductive heating layer is a tantalum-rich TaN layer, the second middle conductive heating layer is a nitrogen-rich TiN layer, and the inside conductive heating layer is a titanium layer.

5. The heater of claim 1, wherein the outside conductive heating layer is a nitrogen-rich TiN outside layer and wherein any remaining layers, comprising at least the inside conductive heating layer, comprise TiN that gradually reduces nitrogen composition towards the inside conductive heating layer, resulting in a nitrogen-rich TiN outside conductive heating layer and a nitrogen-scarce inside conductive heating layer.

6. The heater of claim 1, wherein the heater is a ring-shaped heater and wherein the outside conductive heating layer and the inside conductive heating layer are concentric conductive heating layers.

7. The heater of claim 1, wherein the outside conductive heating layer and the inside conductive heating layer are continuous grading layers, resulting in continuous conductive heating layers.

8. A system comprising:
a phase change memory, the phase change memory comprising:
  a dielectric;
  a heater patterned on the dielectric, the heater comprising:
    an outside conductive heating layer that has a higher electrical resistance than other layers of the heater;
    a first middle conductive heating layer between the outside conductive heating layer and an inside conductive heating layer, the first middle conductive heating layer having a lower electrical resistance than the outside conductive heating layer and a higher electrical resistance than the inside conductive heating layer;
    the inside conductive heating layer that has a lower electrical resistance than the outside conductive heating layer, wherein the outside conductive heating layer is at an outside area of the heater and the inside conductive heating layer is at an inside area of the heater; and
    a second middle conductive heating layer between the first middle conductive heating layer and the inside conductive heating layer, the second middle conductive heating layer having a lower electrical resistance than the first middle conductive heating layer and a higher electrical resistance than the inside conductive heating layer;
  a phase change material proximately connected to the heater; and
  a top electrode proximately connected to the phase change material.

9. The system of claim 8, wherein the outside conductive heating layer has a higher electrical resistivity and the inside conductive heating layer has a lower electrical resistivity, resulting in the higher electrical resistivity at the outside area of the heater and the lower electrical resistivity at the inside area of the heater.

10. The system of claim 8, wherein the outside conductive heating layer has a greater contact resistance and the inside conductive heating layer has a lesser contact resistance, resulting in the greater contact resistance at the outside area of the heater and the lesser contact resistance at the inside area of the heater.

11. The system of claim 8, wherein current transmitted through the heater forms a mushroom cell of amorphous phase change material.

12. The system of claim 11, wherein the forming of the mushroom cell is linear.

13. A method of forming a phase change memory, the method comprising:
  etching a heater via in a dielectric;
  conformally depositing a metal, resulting in a first conductive heating layer;
  repeating conformal deposition of lower resistance metals, wherein each deposition includes a lower resistance metal, resulting in a plurality of graded conductive heating layers graded from high resistance to low resistance, wherein the plurality of graded conductive heating layers includes the first conductive heating layer;
  removing excess material from the plurality of graded conductive heating layers; and
  depositing a phase change material and a top electrode.

14. The method of claim 13, wherein removing the excess material from the plurality of graded conductive heating layers comprises:
  individually removing the excess material from each conductive heating layer, of the plurality of graded conductive heating layers, following the depositing of the conductive heating layer.

15. The method of claim 14, wherein the individually removing the excess material from each conductive heating layer comprises:
  performing an etchback of metal from the conductive heating layer, resulting in portions of the conductive heating layer on each side portion of the heater via.

16. The method of claim 13, wherein repeating the conformal deposition of lower resistance metals comprises:
  individually depositing each conductive heating layer of the plurality of graded conductive heating layers.

17. The method of claim 13, wherein repeating the conformal deposition of lower resistance metals comprises:
  performing continuous grading of the conductive heating layers to fill the heater via.

18. The method of claim 13, wherein a lowest resistance conductive heating layer is at an innermost portion of the heater via and wherein a highest resistance conductive heating layer is at an outermost portion of the heater via.

19. The method of claim 13, further comprising:
  encapsulating at least the phase change material and the top electrode in the dielectric.

* * * * *